United States Patent
Li et al.

(10) Patent No.: US 7,885,075 B2
(45) Date of Patent: Feb. 8, 2011

(54) HEAT DISSIPATION DEVICE

(75) Inventors: Wei Li, Shenzhen (CN); Yi-Qiang Wu, Shenzhen (CN); Chun-Chi Chen, Taipei Hsien (CN)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 48 days.

(21) Appl. No.: 12/396,477

(22) Filed: Mar. 3, 2009

(65) Prior Publication Data

US 2010/0020501 A1    Jan. 28, 2010

(30) Foreign Application Priority Data

Jul. 25, 2008    (CN) .................. 2008 1 0303074

(51) Int. Cl.
*H05K 7/20* (2006.01)

(52) U.S. Cl. ............. 361/701; 361/679.47; 361/679.52; 174/16.3; 165/104.33

(58) Field of Classification Search ................. 361/688, 361/695, 697, 699, 700, 701, 704, 710, 717, 361/719, 720, 679.47, 679.52
See application file for complete search history.

(56) References Cited

U.S. PATENT DOCUMENTS

| | | | |
|---|---|---|---|
| 6,178,088 B1 * | 1/2001 | Gates .......................... | 361/699 |
| 6,570,761 B2 * | 5/2003 | Stone et al. ............ | 361/679.47 |
| 6,900,990 B2 * | 5/2005 | Tomioka ................. | 361/679.54 |
| 7,312,997 B2 * | 12/2007 | Huang et al. ................. | 361/704 |
| 7,414,850 B2 * | 8/2008 | Hung .......................... | 361/719 |
| 7,551,442 B2 * | 6/2009 | Stefanoski .................. | 361/700 |
| 2007/0002537 A1 * | 1/2007 | Tomioka ..................... | 361/695 |
| 2008/0123263 A1 * | 5/2008 | Ueda ........................... | 361/680 |

* cited by examiner

*Primary Examiner*—Jayprakash N Gandhi
*Assistant Examiner*—Courtney Smith
(74) *Attorney, Agent, or Firm*—Frank R. Niranjan

(57) ABSTRACT

A heat dissipation device comprises a heat spreader and heat pipe soldered thereon via a heat conducting material. The heat spreader defines a plurality of cavities in an inner side surface thereof, the heat conducting material is received in the cavities, and the heat pipe contacts and is soldered to the inner side surface of the heat spreader.

13 Claims, 4 Drawing Sheets

HEAT DISSIPATION DEVICE

BACKGROUND OF THE DISCLOSURE

1. Field of the Disclosure

The disclosure relates to heat dissipation devices, and more particularly to a heat dissipation device which has a structure facilitating soldering.

2. Description of Related Art

With developments in computer technology, electronic devices operate at high speed. It is well known such higher speeds increase heat generated. If the heat is not dissipated duly, stability of operation of the electronic devices can be severely affected. Generally, a heat dissipation device is used to dissipate the heat generated by the electronic device.

A typical heat dissipation device comprises a fin assembly, a heat spreader thermally contacting the electronic device, and a heat pipe thermally connecting both the fin assembly and the heat spreader, wherein the heat spreader defines a groove therein. In assembly, a film of heat conducting material is spread on an inner surface of the groove of the heat spreader. The heat pipe is received in the groove of the heat spreader, and the heat pipe and the heat spreader are soldered together via the heat conducting material. However, the heat conducting material is easily squeezed out of the groove of the heat spreader when disposing the heat pipe therein, resulting in an uneven distribution of the heat conducting material, such that the heat pipe cannot be effectively soldered onto the heat spreader.

What is needed, therefore, is a heat dissipation device which can overcome the limitations described.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE DISCLOSURE

Figure 1:
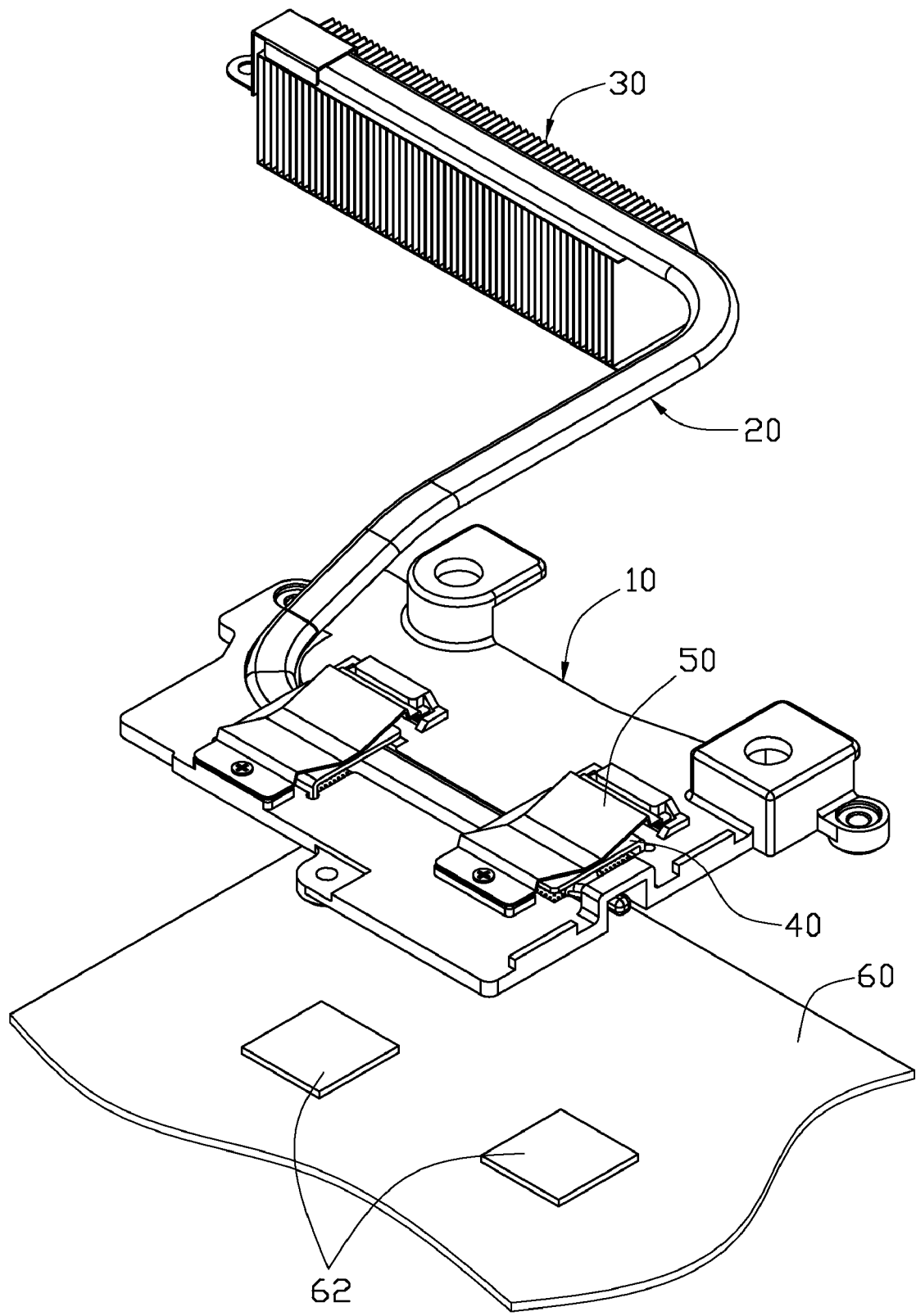
FIG. 1 is an isometric, assembled view of a heat dissipation device in accordance with a first embodiment of the disclosure, with a printed circuit board located below the heat dissipation device.

FIG. 1 shows a heat dissipation device in accordance with a first embodiment of the disclosure. The heat dissipation device is mounted on a printed circuit board 60 and dissipates heat generated by two electronic devices 62 mounted on the printed circuit board 60.

The heat dissipation device comprises a conductive plate 10 located on the printed circuit board 60, a heat pipe 20 with a first end thereof received in and contacting the conductive plate 10, a fin assembly 30 attached to a second end of the heat pipe 20, two heat spreaders 40 attached to the first end of the heat pipe 20 and contacting the two electronic devices 62, and two elastic members 50 fixing the two heat spreaders 40 in the conductive plate 10.

Figure 2:
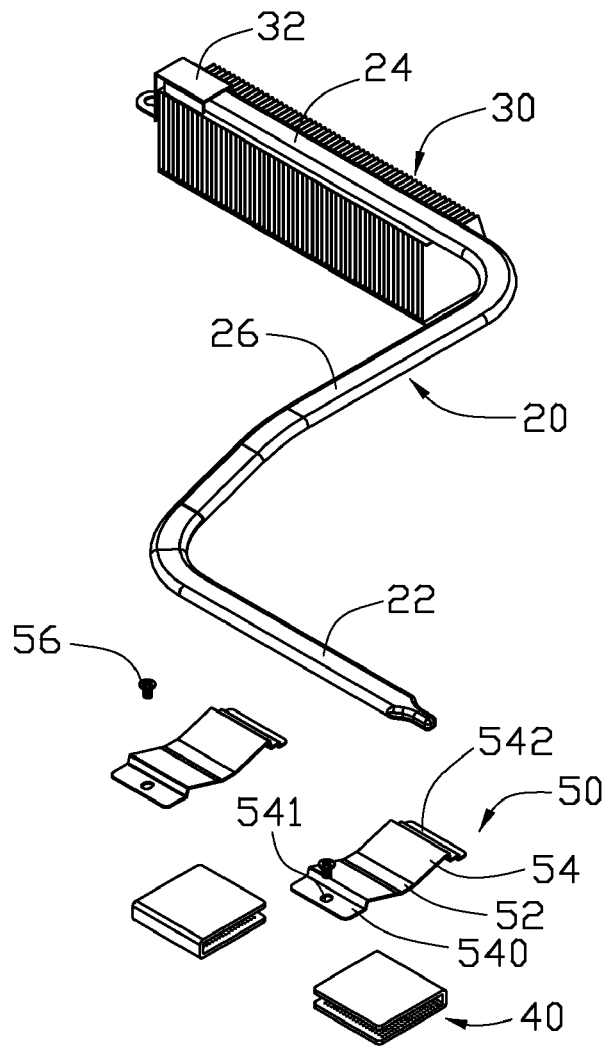
FIG. 2 is an exploded view of the heat dissipation device of FIG. 1.

Also referring to FIG. 2, the conductive plate 10 is metal such as aluminum, copper or an alloy thereof. The conductive plate 10 defines two rectangular holes 12 receiving the two heat spreaders 40 therein and a channel 14 extending through the two rectangular holes 12, receiving the first end of the heat pipe 20. A receiving recess (not labeled) is defined in a top surface of the conductive plate 10 and communicating with a left one of the holes 12 for receiving the heat pipe 20. The recess has an inclined bottom surface such that depth thereof decreases from an end adjacent to a corresponding hole 12 to another end remote from the corresponding hole 12. The conductive plate 10 integrally forms a containing portion 16 and a protruding step 18 at two opposite sides of each rectangular hole 12, respectively. The containing portion 16 includes a bent plate 162 and two side plates 164 connected thereto. The bent plate 162 extends upwardly from a surface of the conductive plate 10 and then horizontally toward the rectangular hole 12. The bent plate 162 and the two side plates 164 cooperatively define a cavity 160 receiving an end of the elastic member 50 therein. The protruding step 18 defines a threaded hole 180 in a center thereof.

The heat pipe 20 comprises an evaporating section 22, a condensing section 24, and an adiabatic section 26 interconnecting the evaporating section 22 and the condensing section 24. The adiabatic section 26 has a slightly curved central portion. The evaporating section 22 and the condensing section 24 are substantially perpendicular to corresponding end portions of the adiabatic section 26 and located at two sides of the adiabatic section 26. Two round corners are formed at corresponding joints of the evaporating section 22, the adiabatic section 26 and the condensing section 24. The heat pipe 20 is flattened and has top and bottom surfaces each formed by a plurality of flat surfaces in different planes. The evaporating section 22 of the heat pipe 20 is accommodated in the channel 14 of the conductive plate 10. The condensing section 24 of the heat pipe 20 is attached to the fin assembly 30.

The fin assembly 30 comprises a plurality of spaced and parallel fins (not labeled) stacked together. The fins each are made of metal such as aluminum, copper or an alloy thereof. A top surface of the fin assembly 30 thermally contacts the bottom surface of the condensing section 24 of the heat pipe 20. A clip 32 is attached to the fin assembly 30 and the heat pipe 20, wherein a first end of the clip 32 surrounds a distal end of the condensing section 24 of the heat pipe 20 and contacts the top surface of the fin assembly 30, and a second end of the clip 32 extends downwardly along a side surface of the fin assembly 30 and then outwardly beyond the fin assembly 30.

Figure 3:
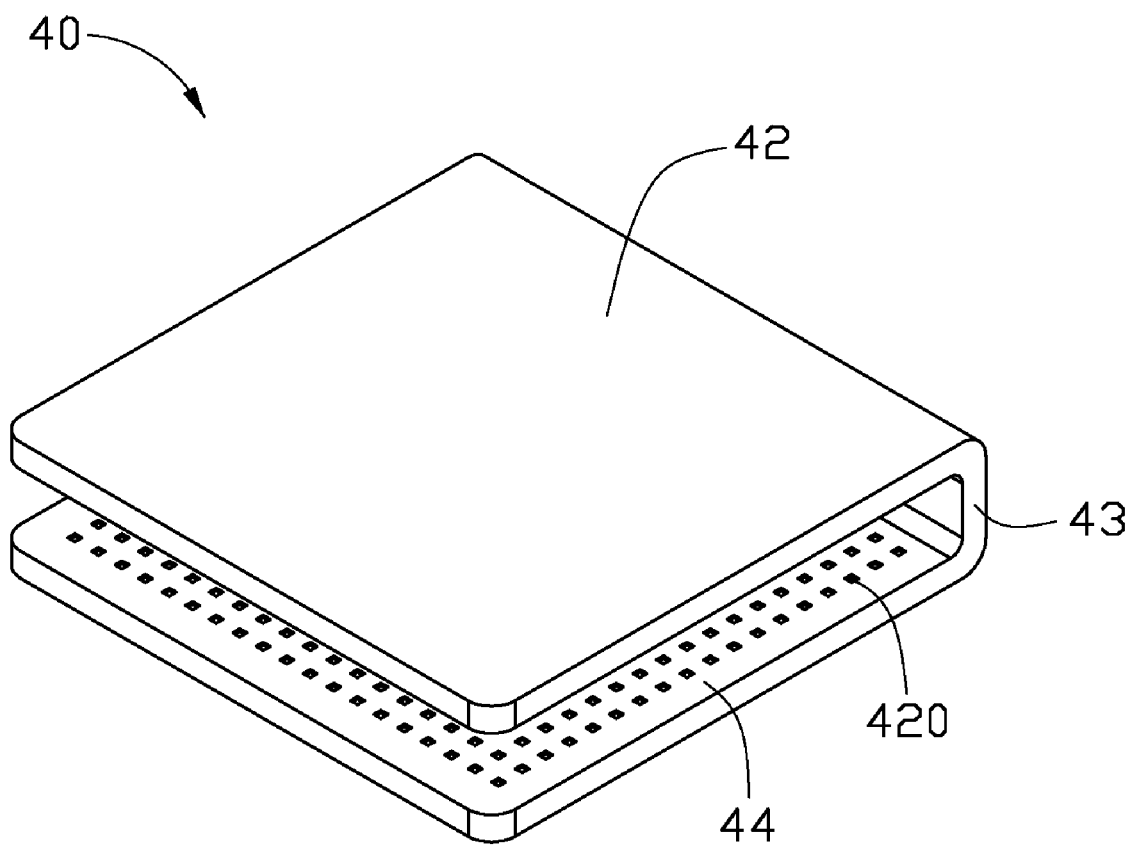
FIG. 3 is an enlarged view of a heat spreader of the heat dissipation device of FIG. 2.

Also referring to FIG. 3, the two heat spreaders 40 are made of metal such as aluminum, copper or an alloy thereof. The two heat spreaders 40 are attached to the evaporating section 22 of the heat pipe 20 and received in the two rectangular holes 12 of the conductive plate 10, and thermally contact the two electronic devices 62 mounted on the printed circuit board 60. The heat spreaders 40 absorb heat from the electronic devices 62 and then convey it to the evaporating section 22 of the heat pipe 20. The two heat spreaders 40 each are integrally formed from a metal plate. The two heat spreaders 40 each have a U-shaped cross section and include a top sandwiching plate 42, a bottom sandwiching plate 44 parallel to the top sandwiching plate 42, and a connecting plate 43 interconnecting the top and bottom sandwiching plates 42, 44. The evaporating section 22 of the heat pipe 20 is sandwiched and soldered between the top and bottom sandwiching plates 42, 44 of the two heat spreaders 40. The top and bottom sandwiching plates 42, 44 each define a plurality of punctate cavities 420 in an inner side surface thereof. The cavities 420 of the top and bottom sandwiching plates 42, 44 are arranged in a discrete matrix array and receive a heat conducting material (not shown) therein. It can be understood that each cavity 420 may be varied to other shapes such as circular and triangular, not being limited to the rectangular profile shown in FIG. 3. The cavities 420 each have a depth less than a thickness of each heat spreader 40. Since the cavities 420 can accommodate the heat conducting material therein, when film of the heat conducting material is spread on the inner side surface of the heat spreaders 40 and the evaporating section 22 of the heat pipe 20 is inserted through the two heat spreaders 40, the heat conducting material is not squeezed out of the heat spreaders 40 and remains evenly distributed on the inner surfaces of the heat spreaders 40, such that the heat pipe 20 can be effectively and consistently soldered on the heat spreaders 40, and an enhanced soldering effect can be obtained.

The two elastic members 50 each are integrally formed from a metal sheet and fix the two heat spreaders 40 in the conductive plate 10 and provide a normal force on the heat spreaders 40 toward the electronic devices 62 so that the heat spreaders 40 can intimately engage the electronic devices 62. The two elastic members 50 each include a rectangular pressing portion 52 located at a center thereof, two arms 54 angling upwardly from two opposite sides of the pressing portion 52, and two fixing portions 540, 542 extending downwardly and then outwardly from two distal ends of the two arms 54, respectively. The fixing portion 540 of each elastic member 50 defines a through hole 541 in a center thereof corresponding to the threaded hole 180 in the protruding step 18 of the conductive plate 10. The fixing portion 542 of each elastic member 50 is received in the cavity 160 of the containing portion 16 of the conductive plate 10. The two arms 54 of each elastic member 50 can be elastically deformed to impel pressing portion 52 onto the top sandwiching plate 42 of the heat spreader 40 after fixing the elastic member 50 on the conductive plate 10, whereby the heat spreader 40 is fixed in the conductive plate 10 and effectively and consistently contacts the electronic device 62.

In assembly, the condensing section 24 of the heat pipe 20 is soldered on the fin assembly 30 via the heat conducting material, whereby the bottom surface of the condensing section 24 thermally contacts the top surface of the fin assembly 30. The film of heat conducting material is spread on the inner side surfaces of the two heat spreaders 40. The evaporating section 22 of the heat pipe 20 extends through and is soldered in the two heat spreaders 40. The heat pipe 20 and the two heat spreaders 40 are accommodated in the channel 14 and the two rectangular holes 12 of the conductive plate 10, respectively. The round corner at the joint of the evaporating section 22 and the adiabatic section 26 is received in the recess of the conductive plate 10, and the adiabatic section 26 angles from the round corner in the recess to extend remotely from the conductive plate 10. The fixing portions 542 of the two elastic members 50 are contained in the cavity 160 of the containing portions 16 of the conductive plate 10. Two screws 56 extend through the through holes 541 of the fixing portions 540 of the two elastic members 50 and engage with the threaded holes 180 in the protruding steps 18 of the conductive plate 10, whereby the two elastic members 50 are fixed on the conductive plate 10. Thus, the heat dissipation device is assembled.

Figure 4:
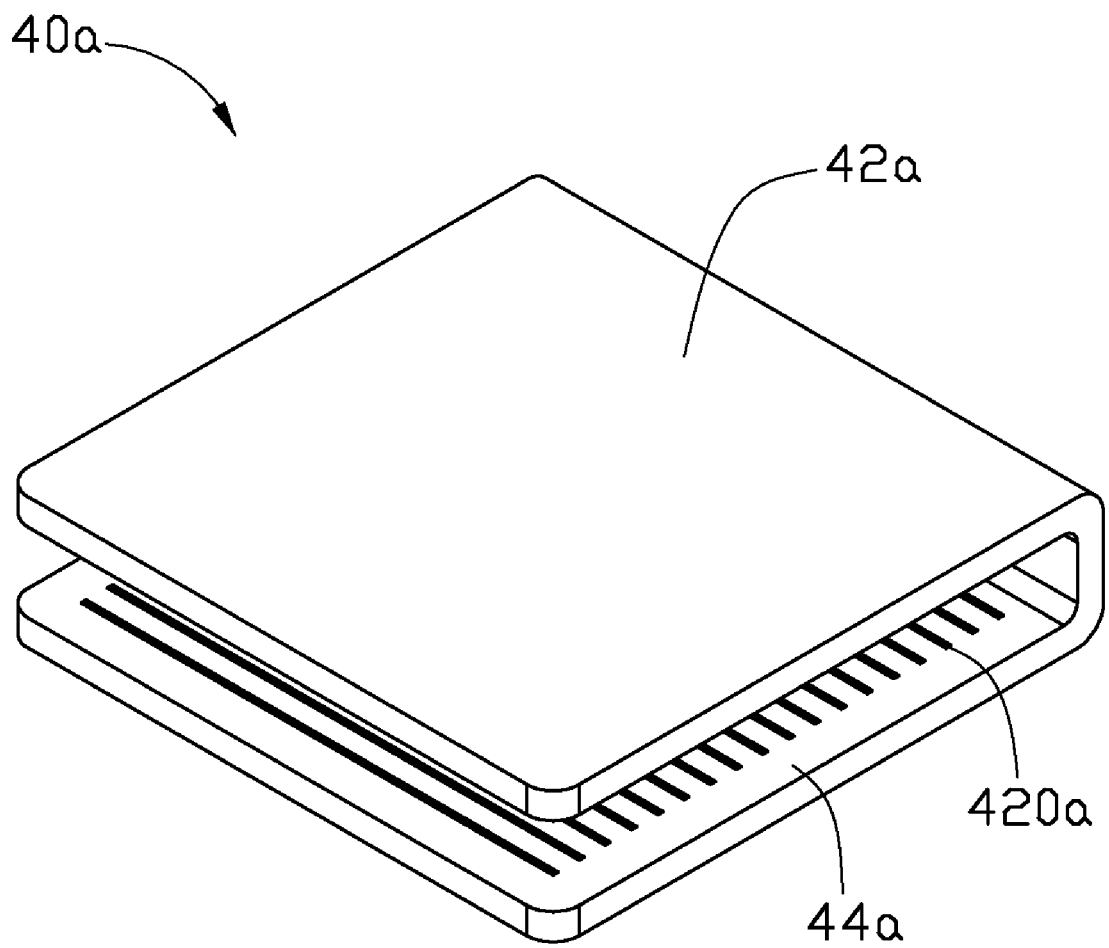
FIG. 4 is an enlarged view of a heat spreader in accordance with a second embodiment of the disclosure.

FIG. 4 shows a heat spreader 40a in accordance with a second embodiment of the disclosure differing from the previous embodiment only in that top and bottom sandwiching plates 42a, 44a each define a plurality of elongated cavities 420a in an inner side surface thereof. The elongated cavities 420a of the top and bottom sandwiching plates 42a, 44a are arranged in a spaced and parallel array and receive the heat conducting material therein.

According to the disclosure, to prevent heat conducting material from being squeezed out of the heat spreaders 40, 40a when inserting the evaporating section 22 of the heat pipe 20 through the heat spreaders 40, 40a, the plurality of punctate or elongated cavities 420, 420a defined in the inner side surface of each heat spreader 40, 40a can accommodate a part of heat conducting material therein, such that the heat conducting material is evenly distributed on the inner surface of the heat spreaders 40, 40a, and the heat pipe 20 is effectively and consistently soldered on the heat spreaders 40, 40a.

It is believed that the disclosure and its advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device mounted on a printed circuited board to dissipate heat generated by an electronic device on the printed circuit board, comprising:
   a heat spreader for contacting the electronic device, the heat spreader comprising a top sandwiching plate, a bottom sandwiching plate parallel to the top sandwiching plate and a connecting plate interconnecting the top and bottom sandwiching plates, a plurality of cavities being defined in inner side surfaces of the top and bottom sandwiching plates; and
   a heat pipe soldered in the heat spreader via a heat conducting material, wherein the heat conducting material is received in the cavities, and the heat pipe is sandwiched and soldered between the top and bottom sandwiching plates of the heat spreader.

2. The heat dissipation device as claimed in claim 1, wherein the cavities of the heat spreader are arranged in a discrete matrix array, and each of the cavities is punctate.

3. The heat dissipation device as claimed in claim 2, wherein each of the cavities is circular, triangular or rectangular.

4. The heat dissipation device as claimed in claim 1, wherein the cavities of the heat spreader are arranged in a spaced array, and each of the cavities is elongated.

5. The heat dissipation device as claimed in claim 1, wherein each of the cavities has a depth less than a thickness of the heat spreader.

6. The heat dissipation device as claimed in claim 1, wherein the heat spreader has a U-shaped cross section.

7. The heat dissipation device as claimed in claim 1, further comprising a conductive plate in which the heat pipe and the heat spreader are received.

8. The heat dissipation device as claimed in claim 7, wherein the heat spreader is for directly contacting the electronic device.

9. The heat dissipation device as claimed in claim 8, further comprising an elastic member fixing the heat spreader in the conductive plate, and the elastic member comprising a pressing portion impelling the top sandwiching plate of the heat spreader, two arms angling from two opposite sides of the pressing portion, and two fixing portions respectively extending from two distal ends of the two arms and attached to portions of the conductive plate located at two opposite sides of the heat spreader.

10. The heat dissipation device as claimed in claim 9, wherein the conductive plate forms a containing portion and a protruding step at two opposite sides of the heat spreader, respectively, the two fixing portions of the elastic member being respectively attached to the containing portion and the protruding step of the conductive plate.

11. The heat dissipation device as claimed in claim 10, wherein the containing portion of the conductive plate comprising a bent plate and two side plates connected to the bent plate, the bent plate extending upward from the conductive plate and then toward the heat spreader, the bent plate and the two side plates cooperatively defining a cavity receiving one of the two fixing portions of the elastic member therein.

12. A heat dissipation device, comprising:
   a heat spreader for contacting an electronic device to absorb heat therefrom;
   a heat pipe soldered in the heat spreader via a heat conducting material, wherein a plurality of cavities receiving the heat conducting material therein are defined in a side of the heat spreader that contacts the heat pipe, the heat pipe comprising an evaporating section, a condensing section, and an adiabatic section interconnecting the evaporating section and the condensing section, the evaporating section and the condensing section being perpendicular to the adiabatic section and located at two sides of the adiabatic section, the heat pipe being flattened, the evaporating section of the heat pipe being soldered in the heat spreader;
   a fin assembly comprising a plurality of fins, the fin assembly thermally connecting the condensing section of the heat pipe; and
   a clip attached to the fin assembly and the heat pipe, wherein an end of the clip surrounds a distal end of the condensing section of the heat pipe and contacts the fin assembly, and another end of the clip extends along a side surface of the fin assembly and then outwardly beyond the fin assembly.

13. A heat dissipation device for dissipating heat generated by an electronic device mounted on a printed circuit board, comprising:
   a plate for being mounted on the printed circuit board, defining a through hole therein;
   a U-shaped heat spreader received in the through hole of the plate, for engaging with the electronic device;
   a heat pipe having an evaporating section received in the U-shaped heat spreader and soldered to an inner surface thereof via a solder, wherein the inner surface of the U-shaped heat spreader defines a plurality of recesses therein, at least a part of the solder being received in the recesses;
   an elastic member being secured to the plate and exerting an elastic force on the U-shaped heat spreader for pushing the U-shaped heat spreader toward the electronic device; and
   a fin assembly connecting with a condensing section of the heat pipe.

* * * * *